(12) United States Patent
Zhou et al.

(10) Patent No.: US 10,816,575 B2
(45) Date of Patent: Oct. 27, 2020

(54) TESTING PROBE, TESTING DEVICE AND TESTING METHOD

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Chao Zhou, Beijing (CN); Xianchun Huang, Beijing (CN); Tao Zhang, Beijing (CN); Zhengyun Wu, Beijing (CN); Tao Geng, Beijing (CN); Youpeng Gan, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 160 days.

(21) Appl. No.: 15/952,691

(22) Filed: Apr. 13, 2018

(65) Prior Publication Data

US 2019/0011480 A1 Jan. 10, 2019

(30) Foreign Application Priority Data

Jul. 7, 2017 (CN) .......................... 2017 1 0549804

(51) Int. Cl.
*G01R 1/073* (2006.01)
*G01R 1/067* (2006.01)

(52) U.S. Cl.
CPC ...... *G01R 1/06722* (2013.01); *G01R 1/07314* (2013.01)

(58) Field of Classification Search
CPC ....................... G01R 1/06722; G01R 1/07314; G01R 1/067; G01R 1/073
(Continued)

(56) References Cited

U.S. PATENT DOCUMENTS 5,233,290 A * 8/1993 Swart ..................... G01R 1/067
200/61.76
5,469,073 A 11/1995 Liebman et al.
(Continued)

FOREIGN PATENT DOCUMENTS

CN 102331568 A 1/2012
CN 102393478 A 3/2012
(Continued)

OTHER PUBLICATIONS

First Office Action for Chinese Application No. 201710549804.0, dated Jan. 30, 2019, 7 Pages.

*Primary Examiner* — Farhana A Hoque
*Assistant Examiner* — Courtney G McDonnough
(74) *Attorney, Agent, or Firm* — Brooks Kushman P.C.

(57) ABSTRACT

The present disclosure provides in some embodiments a testing probe, including a probe holder, and a probe body at least partially extending into an interior of the probe holder and capable of moving relative to the probe holder. The probe body is configured to be electrically connected to the probe holder within a first travel distance relative to the probe holder so as to output a testing signal, and configured to be electrically disconnected from the probe holder within a second travel distance relative to the probe holder.

20 Claims, 5 Drawing Sheets

(58) Field of Classification Search
USPC .......... 324/500, 537, 750.16–755.01, 755.05
See application file for complete search history.

(56) References Cited

U.S. PATENT DOCUMENTS

| | | | |
|---|---|---|---|
| 2002/0093355 A1 | 7/2002 | Parker et al. | |
| 2003/0117164 A1* | 6/2003 | Fujii | G09G 3/006 |
| | | | 324/760.02 |
| 2007/0275610 A1* | 11/2007 | Xu | H01R 13/2421 |
| | | | 439/824 |
| 2010/0019787 A1* | 1/2010 | Huebner | G01R 31/2834 |
| | | | 324/762.03 |
| 2014/0015561 A1 | 1/2014 | Chang et al. | |
| 2015/0285840 A1* | 10/2015 | Matsui | G01R 1/06722 |
| | | | 324/754.14 |

FOREIGN PATENT DOCUMENTS

| | | |
|---|---|---|
| CN | 103543304 A | 1/2014 |
| EP | 2980838 A1 | 2/2016 |
| WO | 2014030536 A1 | 2/2014 |

* cited by examiner

US 10,816,575 B2

TESTING PROBE, TESTING DEVICE AND TESTING METHOD

CROSS-REFERENCE TO RELATED APPLICATION

This application claims priority to Chinese Patent Application No. 201710549804.0 filed on Jul. 7, 2017, which is incorporated herein by reference in its entirety.

TECHNICAL FIELD

The present disclosure relates to a testing probe, a testing device and a testing method.

BACKGROUND

For an array test (AT) device, a contact-type testing mode is adopted, i.e., a testing probe of a probe assembly (PA) is in direct contact with a surface of a base substrate so as to load a testing signal. During the testing, in the case that a PA holder for holding the PA is installed erroneously, or the PA is installed erroneously, or the testing probe descends too much, the testing probe may be in rigid contact with the surface of the substrate. At this time, due to the contact between the testing probe and the substrate, the AT device may still conduct testing the substrate normally. Hence, it is impossible to prevent the substrate from being damaged.

SUMMARY

In one aspect, the present disclosure provides in some embodiments a testing probe, including a probe holder, and a probe body at least partially extending into an interior of the probe holder and capable of moving relative to the probe holder. The probe body is configured to be electrically connected to the probe holder within a first travel distance relative to the probe holder so as to output a testing signal, and configured to be electrically disconnected from the probe holder within a second travel distance relative to the probe holder.

In a possible embodiment of the present disclosure, the probe holder includes a channel configured to receive the probe body and provided at one end with an opening. The probe body includes a first signal transmission member arranged within the channel of the probe holder, a second signal transmission member arranged on an end of the first signal transmission member adjacent to the opening and extending beyond the probe holder through the opening, and a probe head arranged on an end of the second signal transmission member away from the first signal transmission member.

In a possible embodiment of the present disclosure, the first signal transmission member is insulated from the probe holder. The second signal transmission member is configured to be electrically connected to a portion of an inner wall of the channel at the opening within the first travel distance and insulated from the portion of the inner wall of the channel at the opening within the second travel distance.

In a possible embodiment of the present disclosure, an insulation layer is arranged on a portion of the second signal transmission member in contact with the portion of the inner wall of the channel at the opening within the second travel distance.

In a possible embodiment of the present disclosure, the insulation layer is further arranged on an end surface of an end of the first signal transmission member away from the second signal transmission member and on an outer surface of the first signal transmission member.

In a possible embodiment of the present disclosure, the insulation layer is arranged on the inner wall of the channel of the probe holder other than the portion of the inner wall at the opening.

In a possible embodiment of the present disclosure, the first signal transmission member is made of an insulating material.

In a possible embodiment of the present disclosure, the second signal transmission member is insulated from the probe holder, and the first signal transmission member is configured to be electrically connected to the inner wall of the channel within the first travel distance and insulated from the inner wall of the channel within the second travel distance.

In a possible embodiment of the present disclosure, an insulation layer is arranged on a portion of the inner wall of the channel at the opening, and on a portion of the inner wall of the channel in contact with the first signal transmission member within the second travel distance.

In a possible embodiment of the present disclosure, the testing probe further includes a probe end cover arranged at an end of the channel of the probe holder away from the opening, and an elastic member arranged within the channel of the probe holder and connected to the first signal transmission member. The elastic member is under pressure.

In a possible embodiment of the present disclosure, the elastic member includes a spring.

In a possible embodiment of the present disclosure, the first signal transmission member, the second signal transmission member and the probe head are formed integrally.

In a possible embodiment of the present disclosure, the probe head is of a non-sharp shape.

In a possible embodiment of the present disclosure, the probe head is of a rounded shape.

In a possible embodiment of the present disclosure, the probe holder and the probe body are each made of a metallic material.

In a possible embodiment of the present disclosure, the probe holder and the probe body are made of an identical metallic material.

In another aspect, the present disclosure provides in some embodiments a testing device including the above-mentioned testing probe.

In a possible embodiment of the present disclosure, the testing device further includes a probe assembly and a probe assembly holder. The probe assembly includes a plurality of the testing probes.

In a possible embodiment of the present disclosure, the testing device further includes a non-contact-type sensor. The non-contact-type sensor is a voltage-mode optical imaging sensor configured to sense an intensity of a surface electric field of each pixel on a to-be-tested substrate.

In yet another aspect, the present disclosure provides in some embodiments a testing method, including steps of: driving a testing probe to be in contact with a to-be-tested substrate; loading a testing signal to the to-be-tested substrate through the testing probe; and terminating driving the testing probe, in the case that the testing signal is incapable of being loaded to the to-be-tested substrate normally.

BRIEF DESCRIPTION OF THE DRAWINGS

In order to illustrate the technical solutions of the present disclosure in a clear manner, the drawings will be described hereinafter briefly. Obviously, the following drawings

Figure 1A:
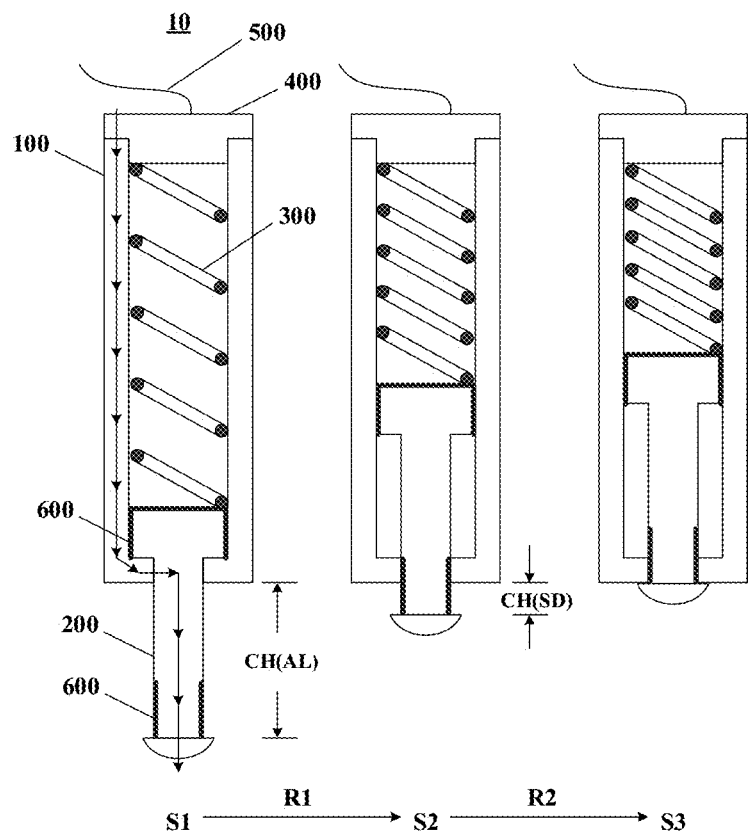
FIG. 1A is a schematic view showing a testing probe according to a first embodiment of the present disclosure.

REFERENCE SIGN LIST 1 testing device
2 substrate
10 testing probe
20 probe assembly
30 probe assembly holder
100 probe holder
110 channel
120 opening
130 inner wall
140 portion of inner wall at opening
200 probe body
210 first signal transmission member
220 second signal transmission member
230 probe head
300 elastic member
400 probe end cover
500 signal application end

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments a testing probe, including a probe holder, and a probe body at least partially extending into an interior of the probe holder and capable of moving relative to the probe holder. The probe body is configured to be electrically connected to the probe holder within a first travel distance relative to the probe holder so as to output a testing signal, and configured to be electrically disconnected from the probe holder within a second travel distance relative to the probe holder. The present disclosure further provides in some embodiments a testing device including the above-mentioned testing probe as well as a testing method.

For an AT device, a contact-type testing mode is adopted, i.e., a testing probe of a PA is in direct contact with, e.g., a testing pad at a surface of a base substrate so as to load a testing signal. Before the loading of the testing signal, a contact test needs to be performed so as to determine a contact condition between the testing probe and the substrate. A principle of the contact test will be described hereinafter. Two groups of probes are provided in each channel. One group of the probes are configured to transmit a signal, and the other group are configured to receive the signal. After the testing signal has been loaded, a resistance between two signal lines may be calculated. In the case that the resistance is relatively small, it means that the testing probe is in well contact with the substrate. In the case that the resistance exceeds a predetermined threshold, it means that the contact fails. During the contact test, in the case that a PA holder for holding the PA is installed erroneously, or the PA is installed erroneously, or the testing probe descends too much, the testing probe may be in rigid contact with the surface of the substrate. At this time, due to the contact between the testing probe and the substrate, the contact test may succeed and the AT device may test the substrate normally. Hence, for the substrate, there exists a risk of being damaged or even broken.

According to the testing probe, the testing device and the testing method in the embodiments of the present disclosure, it is able to monitor a position of the testing probe. In the case that the testing probe is moved by a distance greater than a predetermined safe distance, the testing signal cannot be loaded normally and the contact test may fail. At this time, an alarm may be given by the testing device, and the testing device may not perform the subsequent test. As a result, it is able to prevent the substrate from being damaged.

First Embodiment

The present disclosure provides in this embodiment a testing probe 10 which, as shown in FIG. 1A, includes a probe holder 100, and a probe body 200 at least partially extending into an interior of the probe holder 100 and capable of moving relative to the probe holder 100. The probe body 200 is configured to be electrically connected to the probe holder 100 within a first travel distance relative to the probe holder 100 so as to output a testing signal, and configured to be electrically disconnected from the probe holder 100 within a second travel distance relative to the probe holder 100.

In a possible embodiment of the present disclosure, during the operation of the testing probe 10, the probe body 200 of the testing probe 10 is in contact with a substrate (not shown in FIG. 1A and FIG. 1B), and the testing signal is loaded to the substrate via the probe holder 100 and the probe body 200 (in a transmission path shown by arrows in FIG. 1A). For example, the probe body 200 may be in direct contact with the probe holder 100, so as to load the testing signal. During the test, in order to prevent the testing probe 10 from being in rigid contact with a surface of the substrate and thereby prevent the substrate from being damaged, the probe body 200 may be capable of moving relative to the probe holder 100.

In a possible embodiment of the present disclosure, the testing signal may be a signal loaded to the substrate or received from the substrate during the contact test.

It should be appreciated that, as shown in FIG. 1A, during the movement of the probe body 200 relative to the probe holder 100, a length of a portion of the probe body 200 extending beyond the probe holder 100 is called as a contraction length CH, a maximum movement distance of the probe body 200 relative to the probe holder 100 is called as active length AL, and a movement distance of the probe body 200 relative to the probe holder 100 in a critical state where the probe body 200 is immediately about to be electrically disconnected from the probe holder 100 is called as a safe distance SD. For example, in the case that the contraction length CH is greater than the safe distance SD, the probe body 200 may be electrically connected to the probe holder 100, and in the case that the contraction length CH is smaller than or equal to the safe distance SD, the probe body 200 may be electrically disconnected from the probe bolder 100. The above features may also be applied to the other embodiments of the present disclosure.

In a possible embodiment of the present disclosure, the active length AL of the probe body 200 may be 7 mm, and the safe distance SD may be 1 mm. Of course, the values of the active length AL and the safe distance SD may be set in accordance with the actual application scenarios.

It should be appreciated that, as shown in FIG. 1A, a movement state where the contraction length CH is equal to the active length AL is called as an initial state S1, a movement state where the contraction length CH is equal to the safe distance SD is called as a critical state S2, and a movement state where the contraction length CH is equal to zero is called as a termination state S3. A movement distance of the probe body 200 relative to the probe holder 100 from the initial state S1 to the critical state S2 is called as a first travel distance R1, and a movement distance of the probe body 200 relative to the probe holder 100 from the critical state S2 to the termination state S3 is called as a second travel distance R2. The above features may also be applied to the other embodiments of the present disclosure.

It should be further appreciated that, in FIG. 1A, a left portion shows the testing probe 10 in the initial state S1, a middle portion shows the testing probe 10 in the critical state S2, and a right portion shows the testing probe 10 in the termination state S3, and so do FIG. 2, FIG. 3, FIG. 4 and FIG. 5.

In a possible embodiment of the present disclosure, during the contact test, in the case that a predetermined descending distance for the testing probe 10 has been set, the testing probe 10 may move close to the to-be-tested substrate gradually. Within the first travel distance R1, the contraction length CH is greater than the safe distance SD, so the probe body 200 may be electrically connected to the probe holder 100, so as to output the testing signal to the to-be-tested substrate (e.g., an array substrate). Within the second travel distance R2, the contraction length CH is smaller than the safe distance SD, so the probe body 200 is electrically disconnected from the probe holder 100. To be specific, in the case that the movement distance of the probe body 200 relative to the probe holder 100 is equal to the second travel distance R2, the probe body 200 is electrically disconnected from the probe holder 100. At this time, the testing signal cannot be loaded normally (i.e., the contact test fails), and an alarm may be given by the testing device, so it is impossible to perform the subsequent testing procedure.

According to the testing probe in this embodiment of the present disclosure, the probe body is electrically connected to the probe holder within the first travel distance, and electrically disconnected from the probe holder within the second travel distance. In this way, it is able to monitor the position of the testing probe relative to the to-be-tested substrate. In the case that the movement distance of the testing probe exceeds the predetermined safe distance, the testing signal cannot be loaded normally (i.e., the contact test fails), and an alarm may be given by the testing device, so it is impossible to perform the subsequent testing procedure. As a result, it is able to prevent the to-be-tested substrate from being damaged.

Figure 1B:
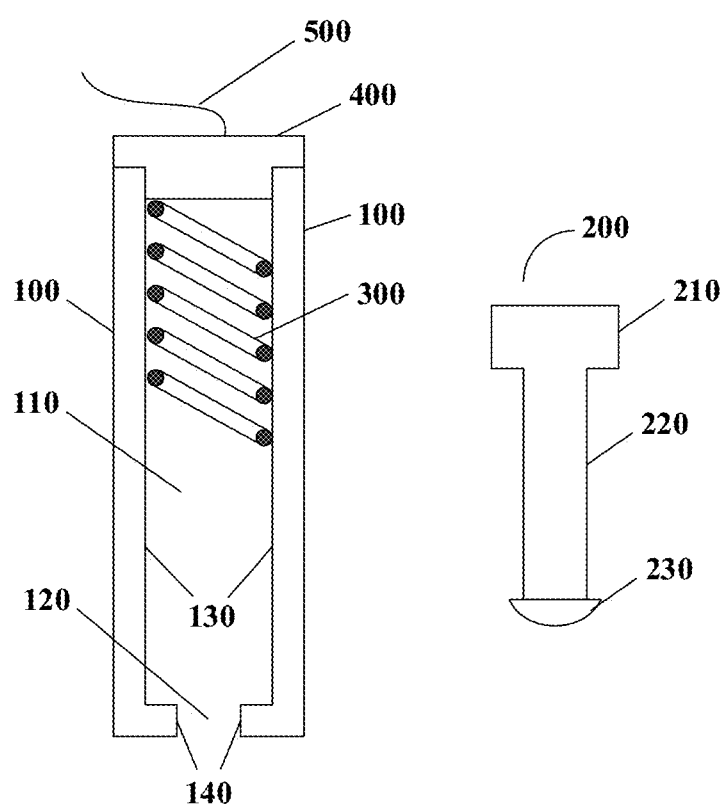
FIG. 1B is an exploded view of the testing probe according to the first embodiment of the present disclosure, in which a probe holder and a probe body have been separated from each other.

In a possible embodiment of the present disclosure, as shown in FIG. 1A and FIG. 1B, the probe holder 100 includes a channel 110 configured to receive the probe body 200 and provided at one end with an opening 120. Shapes of the probe holder 100 and the channel 110 will not be particularly defined herein. The probe body 200 includes: a first signal transmission member 210 arranged within the channel 110 of the probe holder 100, a second signal transmission member 220 arranged on an end of the first signal transmission member 210 adjacent to the opening 120 and extending beyond the probe holder 100 through the opening 120, and a probe head 230 arranged on an end of the second signal transmission member 220 away from the first signal transmission member 210. The probe head 230 may be of a non-sharp shape, e.g., a rounded shape, so as to prevent the testing pad of the to-be-tested substrate from being damaged.

It should be appreciated that, for clarification, FIG. 1B is an exploded view showing the testing probe 10, in which a probe holder 100 and a probe body 200 have been separated from each other. All numeral references shown in FIG. 1B are also applied to FIG. 1A, FIG. 2, FIG. 3, FIG. 4, and FIG. 5.

In a possible embodiment of the present disclosure, the first signal transmission member 210, the second signal transmission member 220 and the probe head 230 of the probe body 200 may be formed integrally, so as to increase the strength of the entire probe body 200 and prevent the occurrence of such defects as deformation.

In a possible embodiment of the present disclosure, the probe holder 100 and the probe body 200 may each be made of a metallic material, or may be made of an identical metallic material (e.g., copper or iron), so as to facilitate the transmission of the testing signal.

In a possible embodiment of the present disclosure, as shown in FIG. 1A and FIG. 1B, the testing probe 10 further includes a probe end cover 400 arranged at an end of the channel 110 of the probe holder 100 away from the opening 120, and an elastic member 300 arranged within the channel 110 of the probe holder 100 and connected to the first signal transmission member 210. For example, the elastic member 300 is under pressure.

Through the elastic member 300 under pressure, it is able to apply a force to the probe body 200, thereby to abut the probe body 200 against the probe holder 100 in the initial state and enable the probe head to extend beyond the probe holder 100. In other words, in the case that the testing probe 10 is in the initial state S1, the probe body 200 may remain still relative to the probe holder 100 prior to being in contact with the to-be-tested substrate, so as to prevent the probe body 200 from moving or shaking randomly, thereby to prevent the to-be-tested substrate from being damaged. In the case that the probe body 200 has been in contact with the to-be-tested substrate, the elastic member 300 may further function as a buffer, so as to prevent the application of an oversize force to the to-be-tested substrate, thereby to prevent the to-be-tested substrate from being damaged by the probe head 230 of the probe body 200.

In a possible embodiment of the present disclosure, the elastic member 300 may be a spring, e.g., a coil spring. Of course, an elastic material may also be filled into the channel 110 of the probe holder 100, so as to provide a function identical to, or similar to, the spring.

It should be appreciated that, the elastic member 300 may be made of a metallic or plastic material, so it may be conductive or non-conductive. In the embodiments of the present disclosure, the description is given by taking the spring as an example.

Through the probe end cover 400, it is able to maintain the elastic member 300 within the channel 110 of the probe holder 100 and maintain the airtightness of the probe holder 100. In FIG. 1A, the elastic member 300 is in direct contact with the probe end cover 400. Of course, in a possible embodiment of the present disclosure, one end of the elastic member 300 away from the probe body 200 may also be directly secured onto an inner wall 130 of the probe holder 100, rather than being in contact with the probe end cover 400.

In a possible embodiment of the present disclosure, the probe end cover 400 may be secured onto the probe holder 100 in a threaded, clamped or welded manner, which will not be particularly defined herein.

In a possible embodiment of the present disclosure, as shown in FIG. 1A and FIG. 1B, the testing probe further includes a signal loading end 500. The signal loading end 500 may be a lead or any other member, as long as it is capable of transmitting the testing signal to the testing probe.

In a possible embodiment of the present disclosure, the first signal transmission member 210 is insulated from the probe holder 100. The second signal transmission member 220 is configured to be electrically connected to a portion of an inner wall 140 of the channel at the opening within the first travel distance R1 and insulated from the portion of the inner wall 140 of the channel at the opening within the second travel distance R2.

Figure 2:
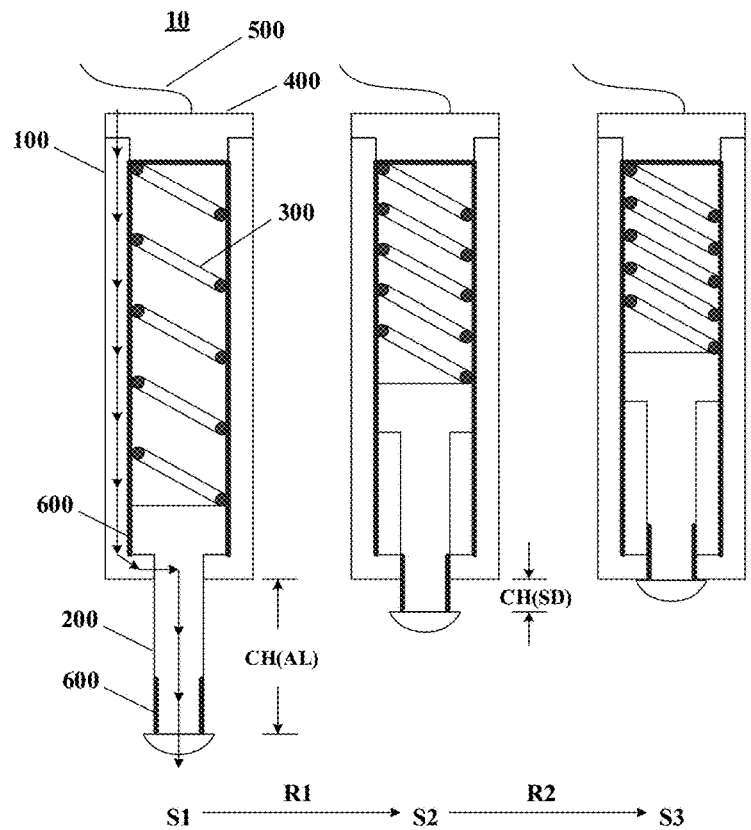
FIG. 2 is another schematic view showing the testing probe according to the first embodiment of the present disclosure.
Figure 3:
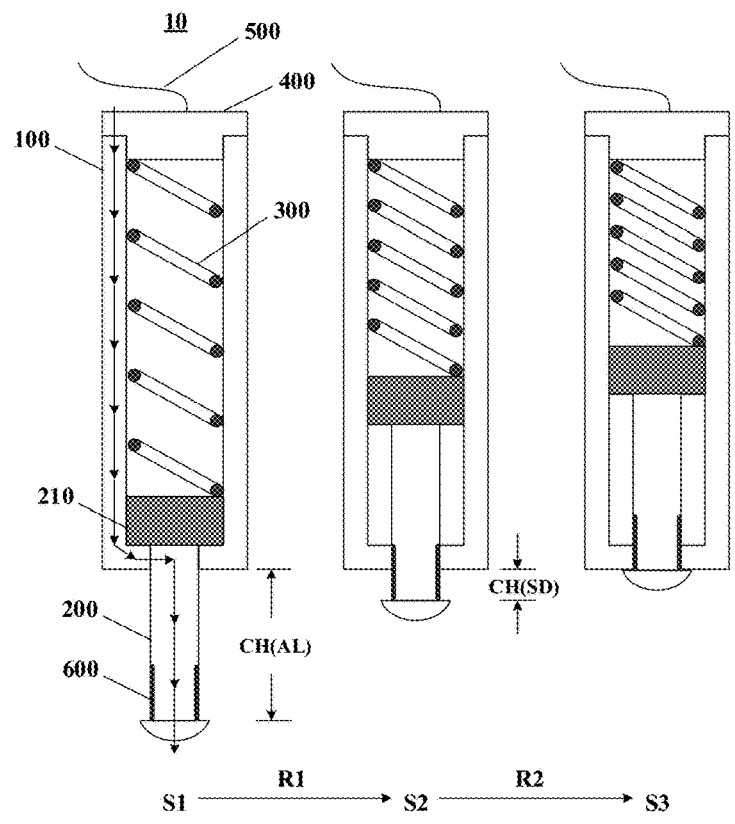
FIG. 3 is yet another schematic view showing the testing probe according to the first embodiment of the present disclosure.

As shown in FIG. 1A, FIG. 2 and FIG. 3, a transmission path of the testing signal is shown by the arrows, i.e., the probe body 200 is merely capable of being electrically connected to the probe holder 100 via the portion of the inner wall 140 at the opening. To be specific, the testing signal is transmitted from the probe end cover 400, to the probe holder 100, to the portion of the inner wall 140 at the opening, to the second signal transmission member 220, and then to the probe head 230. It should be appreciated that, this transmission path is for a left portion of the probe holder. Of course, the testing signal may also be transmitted within a right portion of the probe holder.

In a possible embodiment of the present disclosure, an insulation layer 600 is arranged on a portion of the second signal transmission member 220 in contact with the portion of the inner wall 140 of the channel at the opening within the second travel distance R2.

As shown in FIG. 1A, FIG. 2 and FIG. 3, the insulation layer 600 is arranged on a surface of the second signal transmission member 220 in contact with the portion of the inner wall 140 of the channel at the opening within the second travel distance R2. In this case, a thickness of the insulation layer 600 is equal to a sum of the safe distance SD and a thickness of the portion of the inner wall 140 at the opening. In the case that the contraction length CH of the probe body 200 relative to the probe holder 100 is equal to the safe distance SD, the portion of the inner wall 140 at the opening is insulated from the second signal transmission member 220 through the insulation layer 600, so the probe holder 100 may be electrically disconnected from the probe body 200.

The insulation layer may be an inorganic insulation layer or an organic insulation layer. The inorganic insulation layer may be made of a carbide material, e.g., tungsten carbide (WC) or chromium carbide ($Cr_3C_2$), so as to provide a thin and wear-resistance layer. The organic insulation layer may be made of resin or rubber. The insulation layer may be formed in an appropriate manner, e.g., through electroplating, physical vapor deposition (PVD) or chemical vapor deposition (CVD).

It should be appreciated that, in the embodiments of the present disclosure, the thickness is measured in a movement direction of the probe body relative to the probe holder.

Through the insulation layer 600 on the second signal transmission member 220, it is able for the second signal transmission member 220 to be electrically connected to the portion of the inner wall 140 at the opening within the first travel distance R1 and electrically disconnected from the portion of the inner wall 140 at the opening within the second travel distance R2.

As shown in FIG. 1A, the insulation layer 600 is arranged on an end surface of an end of the first signal transmission member 210 away from the second signal transmission member 220 and on an outer surface of the first signal transmission member 210. It should be appreciated that, in the case that the elastic member 300 is non-conductive, the insulation layer 600 may not be arranged on the end surface of the end of the first signal transmission member 210 away from the second signal transmission member 220.

In a possible embodiment of the present disclosure, as shown in FIG. 1B and FIG. 2, the insulation layer 600 is arranged on the inner wall 130 of the channel of the probe holder 100 other than the portion of the inner wall 140 at the opening. It should be appreciated that, the testing signal needs to be transmitted from the probe holder 100 to the probe body 200 via the portion of the inner wall 140 at the opening, so the insulation layer 600 is not arranged on the portion of the inner wall 140 at the opening. It should be further appreciated that, in the case that the testing probe 10 includes the probe end cover 400, the inner wall 130 of the channel may include an end surface of an end of the probe end cover 400 facing the channel 110. In the case that the elastic member 300 is non-conductive, the insulation layer 600 may not be arranged on the end surface of the end of the probe end cover 400 facing the channel 110.

In a possible embodiment of the present disclosure, as shown in FIG. 3, the first signal transmission member 210 is made of an insulating material, e.g., an inorganic insulating material (e.g., a ceramic material) or an organic insulating material (e.g., resin or plastics). The first signal transmission member 210 is non-conductive, so it is insulated from the probe holder 100. It should be appreciated that, in this case, the second signal transmission member 220 and the probe head 230 still need to be made of a metallic material, so the first signal transmission member 210 is not any more formed integrally with the second signal transmission member 220 and the probe head 230.

It should be appreciated that, the arrangement mode of the insulation layer has been described hereinabove in the case that the first signal transmission member is insulated from the probe holder, but the present disclosure is not limited thereto.

In the first embodiment of the present disclosure, the first signal transmission member is insulated from the probe holder, so the testing signal is merely capable of being transmitted to the probe body via the portion of the inner wall at the opening, i.e., the testing signal is transmitted from the probe end cover to the probe holder, to the portion of the inner wall at the opening, to the second signal transmission member, and then to the probe head. In addition, through the insulation layer on the second signal transmission member, it is able for the probe body to be electrically connected to the probe holder within the first travel distance, and electrically disconnected from the probe holder within the second travel distance. In this way, it is able to monitor a position of the testing probe. In the case that the testing probe is moved by a distance greater than a predetermined safe distance, the testing signal cannot be loaded normally and the contact test may fail. At this time, the alarm may be given by the testing device, and the testing device may not perform the subsequent test. As a result, it is able to prevent the substrate from being damaged.

It should be appreciated that, the to-be-tested substrate in this embodiment may be any appropriate substrate, e.g., an array substrate for a liquid crystal display (LCD) panel or an organic light-emitting diode (OLED) panel.

Second Embodiment

Figure 4:
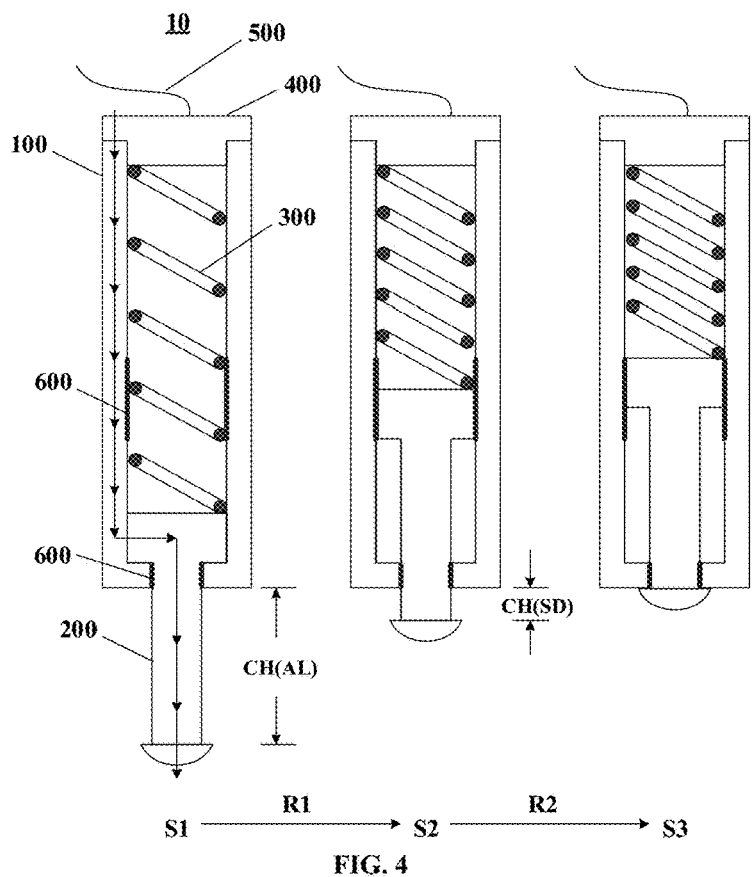
FIG. 4 is a schematic view showing the testing probe according to a second embodiment of the present disclosure.

As shown in FIG. 4, the testing probe 10 in this embodiment differs from that in the first embodiment merely in that the testing signal is transmitted from the probe end cover 400 to the probe holder 100, to the first signal transmission member 210, to the second signal transmission member 220, and finally to the probe head 230.

As shown in FIG. 4, the second signal transmission member 220 is insulated from the probe holder 100, and the first signal transmission member 210 is configured to be electrically connected to the inner wall 130 of the channel within the first travel distance R1 and insulated from the inner wall 130 of the channel within the second travel distance R2.

As shown in FIG. 1B and FIG. 4, the insulation layer 600 is arranged on the portion of the inner wall 140 at the opening, and on a portion of the inner wall in contact with the first signal transmission member 210 within the second travel distance R2.

As shown in FIG. 1B and FIG. 4, through the insulation layer 600 on the portion of the inner wall 140 at the opening, it is able for the second signal transmission member 220 to be insulated from the probe holder 100 all the time during the movement of the probe body 200 relative to the probe holder 100. It should be appreciated that, the second signal transmission member 220 may be insulated from the probe holder 100 through, but not limited to, the insulation layer 600.

As shown in FIG. 4, in the case that the probe body 200 moves relative to the probe holder 100 within the second travel distance R2, the insulation layer 600 is arranged on a portion of the inner wall in contact with the first signal transmission member 210. In this case, a thickness of the insulation layer 600 on the inner wall may be greater than or equal to a sum of the safe distance SD and a thickness of the first signal transmission member 210. In the case that the contraction length CH of the probe body 200 relative to the probe holder 100 is equal to the safe distance SD, the probe holder 100 is insulated from the first signal transmission member 210 through the insulation layer 600 on the inner wall, such that the probe holder 100 is electrically disconnected from the probe body 200.

Figure 5:
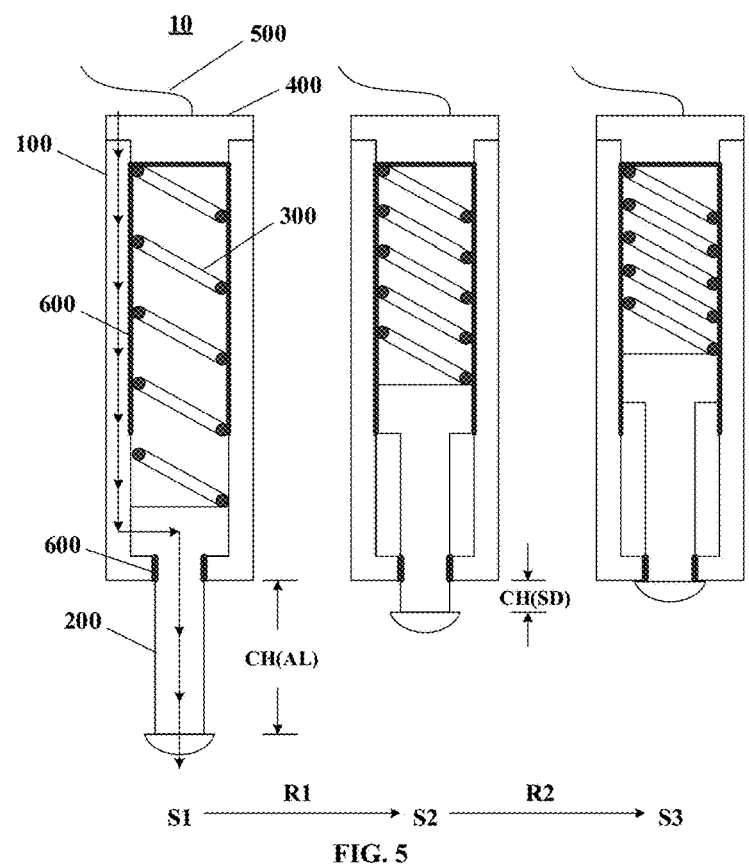
FIG. 5 is another schematic view showing the testing probe according to the second embodiment of the present disclosure.

It should be appreciated that, as shown in FIG. 5, in the case that electric power is to be supplied to the elastic member 300, the insulation layer 600 may also be arranged on a portion of the inner wall in contact with the elastic member 300 within the second travel distance R2, so as to ensure that the first signal transmission member 210 is insulated from the inner wall 130 within the second travel distance R2.

According to the second embodiment of the present disclosure, the second signal transmission member is insulated from the probe holder, and the testing signal is incapable of being transmitted to the probe body through the portion of the inner wall at the opening, i.e., the testing signal is transmitted from the probe end cover to the probe holder, to the first signal transmission member, to the second signal transmission member and finally to the probe head. In addition, through the insulation layer on the inner wall, it is able for the probe body to be electrically connected to the probe holder within the first travel distance and electrically disconnected from the probe holder within the second travel distance. In this way, it is able to monitor a position of the testing probe relative to the to-be-tested substrate. In the case that the testing probe is moved by a distance greater than a predetermined safe distance, the testing signal cannot be loaded normally and the contact test may fail. At this time, an alarm may be given by the testing device, and the testing device may not perform the subsequent test. As a result, it is able to prevent the substrate from being damaged.

Third Embodiment

The present disclosure provides in this embodiment a testing device 1 including the above-mentioned testing probe.

Figure 6:
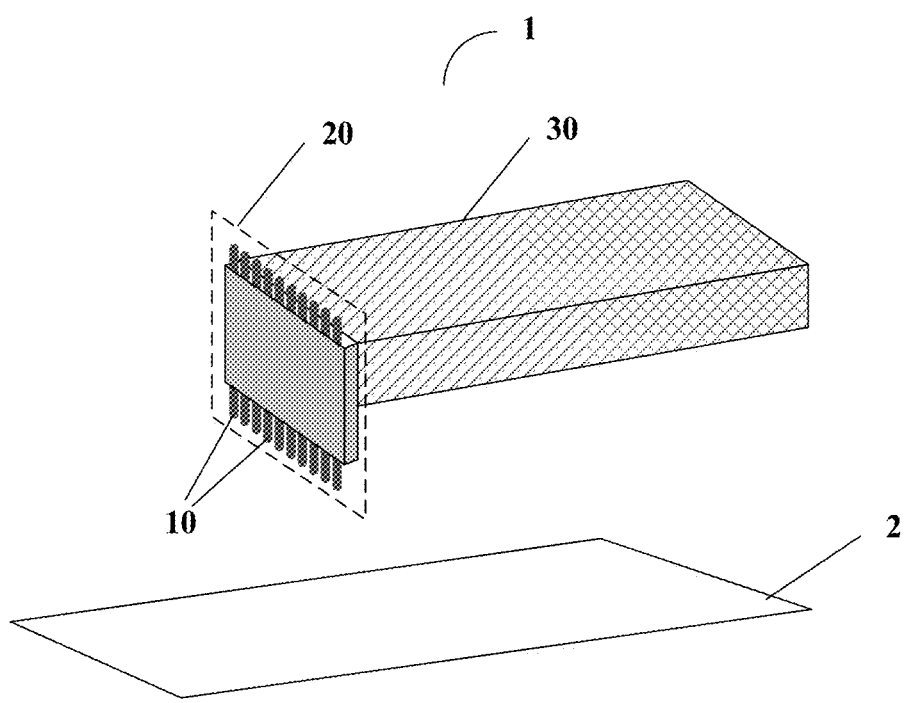
FIG. 6 is a schematic view showing a testing device according to a third embodiment of the present disclosure.

As shown in FIG. 6, the testing device 1 further includes a probe assembly 20 including a plurality of testing probes 10 and a probe assembly holder 30.

The testing device 1 may further include a non-contact-type sensor, e.g., a voltage-mode optical imaging sensor configured to sense an intensity of a surface electric field of each pixel on a to-be-tested substrate, so as to defect an electrical defect of the pixel through voltage comparison.

According to this embodiment of the present disclosure, the testing device includes the above-mentioned testing probe, so it is able to monitor a position of the testing probe relative to the to-be-tested substrate. In the case that the testing probe is moved by a distance greater than a predetermined safe distance, the testing signal cannot be loaded normally and the contact test may fail. At this time, an alarm may be given by the testing device, and the testing device may not perform the subsequent test. As a result, it is able to prevent the substrate from being damaged.

It should be appreciated that, the testing device in this embodiment may be used to detect any appropriate substrate, e.g., an array substrate of an LCD panel or an OLED panel.

Fourth Embodiment

The present disclosure further provides in this embodiment a testing method which includes steps of: driving a testing probe to be in contact with a to-be-tested substrate; loading a testing signal to the to-be-tested substrate through the testing probe; and terminating driving the testing probe, in the case that the testing signal is incapable of being loaded to the to-be-tested substrate normally.

Figure 7:
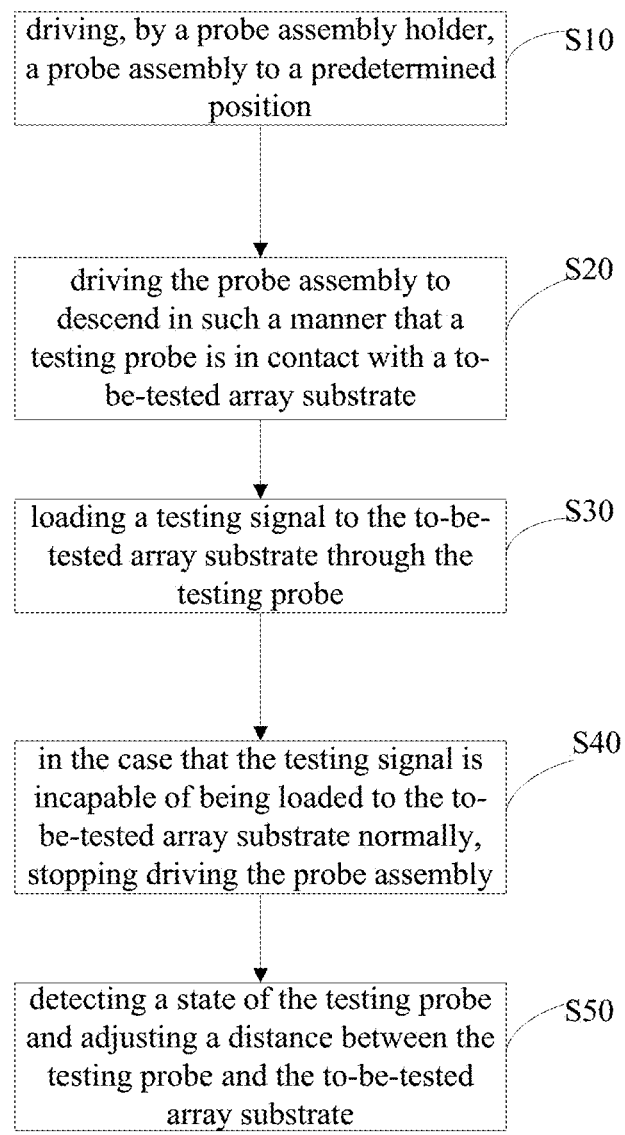
FIG. 7 is a flow chart of a testing method according to a fourth embodiment of the present disclosure.

As shown in FIG. 7, in the case that the to-be-tested substrate is an array substrate, the testing method may include: Step S10 of driving, by a probe assembly holder, a probe assembly to a predetermined position; Step S20 of driving the probe assembly to descend in such a manner that the testing probe is in contact with the to-be-tested array substrate; Step S30 of loading the testing signal to the to-be-tested array substrate through the testing probe; Step S40 of, in the case that the testing signal is incapable of being loaded to the to-be-tested substrate normally, stopping driving the probe assembly; and Step S50 of detecting a state of the testing probe and adjusting a distance between the testing probe and the to-be-tested array substrate.

The testing method in FIG. 7 will be described hereinafter in more details. In the case that the array substrate is tested using the testing device in the third embodiment of the present disclosure, the probe assembly holder may drive the probe assembly to the predetermined position, e.g., above a testing pad of a peripheral circuit of the array substrate. Next, the probe assembly may be driven to descend by a predetermined distance in such a manner that the testing probe is in contact with the to-be-tested array substrate, e.g., the testing pad on the to-be-tested array substrate. During the descent of the probe assembly by the predetermined distance, the testing signal may be loaded. The testing signal may be a contact testing signal for determining a contact state of the testing probe with the array substrate. In the case that the testing signal is incapable of being loaded to the to-be-tested array substrate normally, the driving of the probe assembly may be terminated. For example, in the case that the testing probe is moved by a distance exceeding the predetermined safe distance, the probe body of the testing probe may be electrically disconnected from the probe holder, so the contact testing signal is incapable of being loaded normally, the contact test fails, and an alarm is given by the testing device. At this time, the descent of the probe assembly is stopped, so as to prevent the testing probe from being in rigid contact with the to-be-tested array substrate. Finally, in the case that the alarm has been given by the testing device, the state of the testing probe may be detected, and the distance between the testing probe and the to-be-tested array substrate may be adjusted, so as to facilitate the subsequent test.

It should be appreciated that, the testing method in this embodiment may be performed manually, or automatically through a predetermined program.

The technical effect of the testing method may refer to that mentioned in the third embodiment, and thus will not be particularly defined herein.

It should be appreciated that, shapes and sizes of the members in the drawings are for illustrative purposes only, but shall not be used to reflect any actual scale.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A testing probe, comprising a probe holder, and a probe body at least partially extending into an interior of the probe holder and capable of moving relative to the probe holder, wherein the probe body is configured to be electrically connected to the probe holder within a first travel distance relative to the probe holder so as to output a testing signal, and configured to be electrically disconnected from the probe holder within a second travel distance relative to the probe holder;

wherein a length of a first portion of the probe body is greater than a length of a second portion of the probe body, and wherein the first portion of the probe body is a portion extending out of the probe holder within the first travel distance, and the second portion of the probe body is a portion extending out of the probe holder within the second travel distance.

2. The testing probe according to claim 1, wherein the probe holder comprises a channel configured to receive the probe body and provided at one end with an opening; and the probe body comprises a first signal transmission member arranged within the channel of the probe holder, a second signal transmission member arranged on an end of the first signal transmission member adjacent to the opening and extending beyond the probe holder through the opening, and a probe head arranged on an end of the second signal transmission member away from the first signal transmission member.

3. The testing probe according to claim 2, wherein the first signal transmission member is insulated from the probe holder; and the second signal transmission member is configured to be electrically connected to a portion of an inner wall of the channel at the opening within the first travel distance and insulated from the portion of the inner wall of the channel at the opening within the second travel distance.

4. The testing probe according to claim 3, wherein an insulation layer is arranged on a portion of the second signal transmission member in contact with the portion of the inner wall of the channel at the opening within the second travel distance.

5. The testing probe according to claim 4, wherein the insulation layer is further arranged on an end surface of an end of the first signal transmission member away from the second signal transmission member and on an outer surface of the first signal transmission member.

6. The testing probe according to claim 4, wherein the insulation layer is arranged on the inner wall of the channel of the probe holder other than the portion of the inner wall at the opening.

7. The testing probe according to claim 4, wherein the first signal transmission member is made of an insulating material.

8. The testing probe according to claim 2, wherein the second signal transmission member is insulated from the probe holder, and the first signal transmission member is configured to be electrically connected to the inner wall of the channel within the first travel distance and insulated from the inner wall of the channel within the second travel distance.

9. The testing probe according to claim 8, wherein an insulation layer is arranged on a portion of the inner wall of the channel at the opening, and on a portion of the inner wall of the channel in contact with the first signal transmission member within the second travel distance.

10. The testing probe according to claim 2, further comprising a probe end cover arranged at an end of the channel of the probe holder away from the opening, and an elastic member arranged within the channel of the probe holder and connected to the first signal transmission member, wherein the elastic member is under pressure.

11. The testing probe according to claim 10, wherein the elastic member comprises a spring.

12. The testing probe according to claim 2, wherein the first signal transmission member, the second signal transmission member and the probe head are formed integrally.

13. The testing probe according to claim 2, wherein the probe head is of a non-sharp shape.

14. The testing probe according to claim 13, wherein the probe head is of a rounded shape.

15. The testing probe according to claim 1, wherein the probe holder and the probe body are each made of a metallic material.

16. The testing probe according to claim 15, wherein the probe holder and the probe body are made of an identical metallic material.

17. A testing device, comprising the testing probe according to claim 1.

18. The testing device according to claim 17, further comprising a probe assembly and a probe assembly holder, wherein the probe assembly comprises a plurality of the testing probes.

19. The testing device according to claim 18, further comprising a non-contact-type sensor, wherein the non-contact-type sensor is a voltage-mode optical imaging sensor configured to sense an intensity of a surface electric field of each pixel on a to-be-tested substrate.

20. A testing method using the testing device according to claim 17, comprising:
- driving a testing probe to be in contact with a to-be-tested substrate;
- loading a testing signal to the to-be-tested substrate through the testing probe; and
- terminating driving the testing probe, in the case that the testing signal is incapable of being loaded to the to-be-tested substrate normally.

* * * * *